United States Patent [19]

Adam

[11] Patent Number: 4,499,388
[45] Date of Patent: Feb. 12, 1985

[54] SELECTION CIRCUIT FOR THREE OR FOUR POTENTIALS

[75] Inventor: Fritz G. Adam, Freiburg, Fed. Rep. of Germany

[73] Assignee: ITT Industries, Inc., New York, N.Y.

[21] Appl. No.: 359,532

[22] Filed: Mar. 18, 1982

[30] Foreign Application Priority Data

Apr. 1, 1981 [EP] European Pat. Off. ........ 81102461.1

[51] Int. Cl.³ .................... H03K 19/094; H03K 19/20
[52] U.S. Cl. .................................. 307/474; 307/451; 307/473; 307/585
[58] Field of Search ............... 307/445, 448, 451, 473, 307/474, 463, 585, 270; 365/184, 185, 189; 340/784, 785, 803, 804

[56] References Cited

U.S. PATENT DOCUMENTS

| | | | |
|---|---|---|---|
| 3,936,676 | 2/1976 | Fujita | 307/270 |
| 4,038,564 | 7/1977 | Hakata | 307/270 X |
| 4,309,701 | 1/1982 | Nishimura | 307/474 X |
| 4,324,991 | 4/1982 | Tamaki | 307/473 X |
| 4,408,135 | 10/1983 | Yuyama et al. | 307/451 X |

FOREIGN PATENT DOCUMENTS 680173 8/1979 U.S.S.R. ............... 307/473

*Primary Examiner*—Larry N. Anagnos
*Attorney, Agent, or Firm*—James B. Raden; Edward J. Brosius

[57] ABSTRACT

In order to obtain a low as possible generator internal resistance, a first inverter (IV1) is arranged between the first and the third potential (U1, U3), and the switching section of a second inverter (IV2) is connected to the zero point of the circuit and to the output of the first inverter (IV1) which is modified in such a way that between the switching sections of its two transistors (T21, T22) there is inserted an intermediate transistor (MT). The point connecting the switching sections of the intermediate transistor (MT) and of the other transistor (T22) of the second inverter (IV2) is the output of the selection circuit and is arranged, via the switching section of an additional transistor (ZT) to the second potential (U2). A first or a second selection signal (a, b) is applied to the input of the first or a second inverter (IV1, IV2) and a third selection signal (c) is applied to the gates of the intermediate and the additional transistor (MT, ZT), with the following Boolean logic functions applying to said third selection signal (c):

$$c = \overline{\overline{a} \cdot b} = a + \overline{b} \text{ or } c = \overline{a \cdot b} = \overline{a} + \overline{b}.$$

For selecting the four potentials (U0, U1, U2, U3) with the aid of a two-digit binary signal (A, B) there is used an input logic gate supplied with it on the input side and which is composed either of a NAND gate (NA) and of a maximum of three inverters (I1, I2, I3) or else of a NOR gate (NO) and of maximum of five inverters (N1 ... N5), which are voltage supplied by the lowest and the highest ones of the four potentials (U0, U3).

10 Claims, 9 Drawing Figures

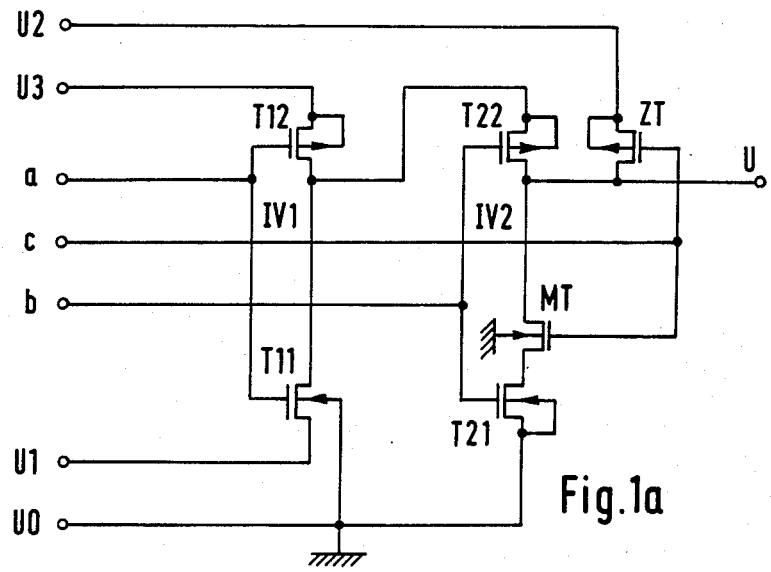
Fig. 1a
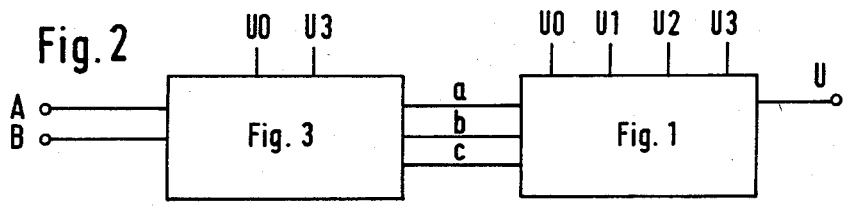
Fig. 1b
Fig. 2

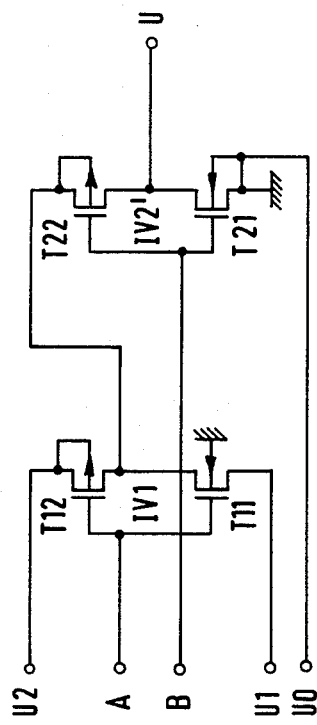

SELECTION CIRCUIT FOR THREE OR FOUR POTENTIALS

BACKGROUND OF THE INVENTION

1. Field of the Invention

The invention relates to an integrated selection circuit for four potentials, namely that of the zero point of the circuit (U0) and three potentials U1, U2, U3 differing therefrom, and which is realized in a complementary insulated-gate field-effect transistor technology, hence the so-called CMOS technology.

2. Description of the Invention

In certain cases of practical application of the CMOS technology, the problem arises of connecting potentials as low ohmic as possible to predetermined circuit parts of a voluminous circuit system. One such case of practical application, for example, exists with the subject matter of the simultaneously filed European Patent Application entitled "Integrated circuit for the writing, reading and erasing of storage matrices with the aid of insulated-gate field effect transistors having a non-volatile storage behaviour" having the European filing number 81102460.3, which will be also further filed in the United States of America. In this case of practical application, the potentials to be connected through are intended to serve the programming of the transistors having a non-volatile storage behaviour. The invention, however, is in no way restricted to this particular case of practical application, but may be used in all cases where a CMOS circuit is required for the selection of a maximum of four potentials, and with the internal resistance thereof, as seen from the output, being supposed to be as low-ohmic as possible.

SUMMARY OF THE INVENTION

The invention solves the problem of providing a selection circuit integrated in accordance with the CMOS technology, for four potentials, whose internal resistance, as seen from the output, is as low-ohmic as possible. The advantage of the selection circuit according to the invention resides in that it only includes a small number of components, namely a conventional CMOS inverter, and the claimed modified inverter as well as an additional transistor, so that the layout of the integrated circuit requires little surface space. In a claimed simplification of the invention there may even be done without the additional transistor and the intermediate transistor modifying the second inverter, so that the selection circuit according to the invention merely consists of two CMOS inverters coupled to one another in the claimed manner.

With respect to a particular special case of the invention, namely in which the four potentials are to be assigned to the four states of a two-digit binary signal A, B, particularly advantageous embodiments of an input logic circuit are set forth in the subclaims as further embodiments of the selection circuit according to the invention. Accordingly, with the aid of these further embodiments, it is possible, by arbitrarily assigning the four potentials to the four states of the two-digit binary signal A, B, to adapt the concrete circuit to the concrete case of need as required.

BRIEF DESCRIPTION OF THE DRAWINGS

FIGS. 1a and 1b show the selection circuit according to the invention.

FIG. 2 shows the interconnection of the selection circuit according to FIG. 1a and an input logic circuit according to FIGS. 3.1 to 3.16.

FIGS. 3.1 to 3.8 show the embodiments of the input logic circuit possible in combination with the selection circuit according to FIG. 1 wherein the input logic circuits employ a NAND gate and a maximum of three inverters.

FIGS. 3.9 to 3.16 show the embodiments of the input logic circuit possible in combination with the selection circuit according to FIG. 1 wherein the input logic circuits employ a NOR gate with a maximum of five inverters.

FIG. 4 shows a particularly favorable simplification of the selection circuit according to FIG. 1.

FIG. 5 shows the reduced input logic circuits for effecting the simplification according to FIG. 4.

DESCRIPTION OF THE INVENTION

The circuit diagram of the selection circuit according to the invention as shown in FIG. 1a, shows the first inverter IV1 whose switching section is lying between the first potential U1 and the third potential U3. The substrate of the transistor T11 connected to the potential U1 is connected to the zero point of the circuit and, accordingly, to the potential U0 thereof and which, for the purposes of description, may also be referred to as the fourth potential. The substrate of the other transistor T12 of the first inverter IV1 is connected to the third potential U3.

The first inverter IV1 is a conventional CMOS inverter, i.e. the switching sections of its two transistors T11, T12 are connected in series, and the gates of these two transistors are connected to one another and form the inverter input, while the point connecting the switching sections of the two transistors T11, T12 forms the inverter output.

Moreover, the circuit diagram of FIG. 1a shows the second inverter IV2 which is in such a way modified with respect to a conventional CMOS inverter, that between the switching sections of the two transistors T21, T22 there is inserted the switching section of the intermediate transistor MT. The second inverter is arranged between the zero point of the circuit, hence the potential U0 thereof, and the output of the first inverter IV1. The substrate of the transistor T21 is connected to the zero point of the circuit just like that of the intermediate transistor MT, while the substrate of the transistor T22 forms its own insulating island for this particular transistor, and is connected to the source electrode thereof, as well as to the output of the first inverter. The gates of the transistors T21, T22 are connected to one another and form the inverter input while the point connecting the switching sections of the intermediate transistor MT and the transistor T22 form the inverter output and also the output of the selection circuit. The channel conduction type of the intermediate transistor MT is the same as that of the transistor T21. The second potential U2 is connected via the switching section of the additional transistor ZT, whose channel conduction type is the same as that of the transistor T22, to the output of the selection circuit. The additional transistor ZT has as a substrate an insulating island of its own, which is connected to the source electrode of this transistor. A first and a second selection signal a, b are applied to the input of the first and the second inverter IV1, IV2 respectively, while to the gates of the intermediate and the additional transistors MT, ZT there is fed the third selection signal c. This and the two other selection signals a, b depend on each other by one of the two Boolean logic functions:

$$c=\overline{\overline{a}\cdot b}=a+\overline{b} \text{ or } c=\overline{a\cdot\overline{b}}=\overline{a}+b$$

FIG. 1b shows with respect to the two logic functions the corresponding assignment of the output voltage U of the selection circuit to the four potentials U0 ... U3. The table as shown in FIG. 1b applies on the further condition that the four potentials satisfy the relationship $$U2, U3 > U1 > U0$$

In cases where the selection circuit is realized in accordance with the known CMOS technology with n-insulating islands in the p-substrate of a semiconductor body, or else that the requirement $$U2, U3 < U1 < U0$$

is met when the selection circuit is designed in accordance with the known CMOS technology employing p-insulating islands in the n-substrate of the semi-conductor body.

According to an advantageous further embodiment of the invention, the selection of the four potentials U0 ... U3 may be carried out with the aid of the four states of the two-digit binary signal A, B as applied to the input logic gate, with the first, the second, or the third selection signal a, b, c resulting at the first, the second or the third output thereof respectively. The interconnection of the selection circuit according to FIG. 1 and the input logic gate is schematically shown in FIG. 2, while the possible versions of the input logic gate are shown in the individual parts of FIGS. 3.1 to 3.16. Two of the four potentials which, in terms of magnitude, are the lowest and the highest ones, are fed as supply voltage to the input logic gate; in the example of embodiment as shown in FIG. 2, these are the potentials U0 and U3.

The input logic gate may be realized either with the aid of the NAND gate NA and a maximum of three inverters I1, I2, I3, as is shown in FIGS. 3.1 to 3.8, or else with the aid of the NOR gate NO and maximum of five inverters N1 ... N5, as is shown in FIGS. 3.9 to 3.16.

FIGS. 3.1 to 3.4 show the NAND versions of the logic function $c=\overline{a}+b$, while FIGS. 3.5 to 3.8 show the NAND versions of the logic function $c=a+\overline{b}$. In a comparative way, the FIGS. 3.9 to 3.12 show the NOR versions of the logic function $c=\overline{a}+b$, and FIGS. 3.13 to 3.16 show the NOR versions of the logic function $c=a+\overline{b}$.

In each of the just mentioned groups of figures, the four possibilities of assigning the four potentials U0 ... U3 to the four states of the two-digit binary signal AB, which are possible under the aforementioned conditions, in a tabular way, showing the respective possible circuit versions. Thus, with respect to each of the four possible assignments, FIGS. 3.1 to 3.4 show a circuit which is indicated by the corresponding circuit number 1 ... 4. For each of the four possibilities, FIGS. 3.5 to 3.8 show two circuit versions which are indicated by the numerals 5a, 5b ... 8a, 8b. For each of the four possibilities, FIGS. 3.9 to 3.12 show four circuit versions which are indicated by the numerals 9a, 9b, 9c, 9d; 10a ... 10d; 11a ... 11d; 12a ... 12d. Finally, for each of the four possibilities, FIGS. 3.13 to 3.16 again show two circuit versions indicated by the numerals 13a, 13b ... 16a, 16b.

In the individual parts of FIG. 3, and with respect to the NAND versions, the maximum of three inverters is indicated by I1, I2, I3, with the inverter as supplied on its input with the first binary signal digit A, being indicated I1, with the inverter as supplied on its input with the second binary signal digit B, being indicated I2, and the inverter as supplied on its input from the output of the Inverter I1, being indicated by I3. Moreover, it applies in common to the individual circuit of the respective NAND version, that the third selection signal c appears at the output of the NAND gate NA. With respect to the first and the second selection signal a, b there results the combination with the binary signal digits A, B from the respective partial figure of FIG. 3. Since these partial figures speak for themselves, this figure is not explained in detail in the specification, especially since it is easy for the person skilled in the art to see the interconnection of the respective NAND versions from the drawing.

In the NOR versions as shown in FIGS. 3.9 to 3.16, the NOR gate is indicated by N0, while the maximum of five inverters are indicated by the references N1 ... N5. The inverter which on its input is supplied with the first binary signal digit A, is indicated by the reference N1, and the inverter which on its input is supplied with the second binary signal digit B, is indicated by the reference N2. The inverter which on its input is connected to the output of the first inverter N1, is indicated by the reference N3, and the inverter which on its input is connected to the output of the inverter N2, is indicated by the reference N4 while the inverter which on its input is connected to the output of the NOR gate N0, is indicated by the reference N5.

The assignment of the first, the second and the third selection signal a, b, c can be easily seen from the individual partial figures of FIGS. 3.9 to 3.16, so that also in this case there may be done without an individual description of the partial figures, because the person skilled in the art will be easily able to see this from the partial figures.

It is to be emphasized that in all of the partial figures of FIG. 3 there is not necessarily included the total number of possible inverters; thus, for example, FIG. 3.1 shows no inverter at all while the maximum of three inverters is only shown in FIGS. 3.7b and 3.8b. In a similar way, FIGS. 3.13a and 3.15b only show two inverters, and FIGS. 3.9b, 3.10d, 3.11c and 3.12a show the maximum number of five inverters.

Of particular interest are those versions of FIG. 3 in which the potential U0 which is the lowest according to the amount, hence the potential of the zero point of the circuit, is assigned to the zero state 00 of the binary signal AB at the output of the potential selection circuit, because then, in the event of a failure of the binary signal, a waiting or standby operation in the successively following circuit behind the output of the potential selection circuit can be easily realized. Logic zero (e.g. A=0) and logic one (e.g. A=1) are so defined that the potential associated with the logic zero is closer to the substrate potential U0 of the CMOS circuit than the potential associated with the logic one. These circuit versions are shown in FIGS. 3.3, 3.8, 3.11 and 3.16. Of the respective possible versions of FIGS. 3.8, 3.11 and 3.16, insofar as the circuit investment is concerned, again FIGS. 3.8b, 3.11b and 3.16b are particularly favorable, because these circuit versions include the respective smallest number of inverters. Accordingly, the input logic gates of the partial FIGS. 3.3, 3.8b, 3.11d and 3.16b are the most preferred ones and, therefore, characterized in claims 5 to 8.

FIG. 4 shows a simplification of the selection circuit according to FIG. 1, which is within the scope of the invention, and which results from the fact that the two potentials U2, U3 are identical. In that case, it is possible to do without the intermediate transistor MT and without the additional transistor ZT as shown in FIG. 1. The possible input logic gates are then reduced to the four as shown in FIGS. 3.1 ... 3.4, by omitting the NAND gate and the selection signal c. FIG. 5 shows the then applicable truth tables and circuits. In FIG. 4, the two-digit binary signal A, B is shown to be fed directly to the input of the first inverter IV1 or to that of the second inverter IV2' respectively, cf. FIG. 5.1; accordingly, this circuit merely includes the two inverters IV1, IV2'. The output voltages U as associated with the four states of the binary signal A, B are shown in the Table of FIG. 5a. As can be seen from this, the potential U0 is assigned to two of the four states, namely to the zero state 00 and to the further state 10. This property, according to which in the case of three potentials to be connected through, only one of the potentials is assigned to two binary signal states, results from the non-coincidence between the number of potentials and the number of binary signal states.

The simplification according to FIG. 4 represents the most simple selection circuit for three potentials. In starting out from the selection circuit as shown in FIG. 1, however, there are also circuits which are to be interconnected with input logic gates which, by connecting the terminals for the potentials U2, U3, can likewise be made into such ones with the aid of which three potentials may be selected.

What is claimed is:

1. An integrated selection circuit for four potentials corresponding to the zero point of the circuit (U0) and three potentials differing therefrom, (U1, U2, U3), which is realized in a complementary insulated-gate field-effect transistor (CMOS) technology, comprising:

a first inverter (IV1) comprising first and second complementary channel type transistors (T11, T12) connected in series between the first (U1) and the third potential (U3), said first transistor (T11) connected to the first potential (U1) with its substrate connected to the zero point of the circuit (U0), and said second transistor (T12) having its substrate connected to the third potential (U3); and a second inverter (IV2) comprising two complementary channel type transistors (T21, T22) and intermediate transistor (MT), all connected in series, and having intermediate transistor (MT) connected between the transistors (T21, T22), said intermediate transistor (MT) being of the same channel conduction type as that of the transistor (T21) that is connected to the zero point of the circuit, the second inverter being connected between the zero point of the circuit and the output of the first inverter (IV1), the substrate of the transistor T21 is connected to the zero point of the circuit and the substrate of the intermediate transistor (MT) is also connected to the zero point of the circuit, and the substrate of the other transistor T22 forming an insulated island and is connected to the source electrode thereof and to the output of the first inverter, a connection between the intermediate transistor (MT) and the other transistor T22 of the second inverter (IV2) is the output of the selection circuit, an additional transistor (ZT) being of the same channel-conduction type as that of said other transistor T22 is connected by its source electrode to the second potential (U2) and by its drain electrode to the output of the selection circuit, the substrate of said additional transistor (ZT) forms an insulating island of its own which is connected to the source electrode of said additional transistor (ZT);

the four potentials satisfying the relationship: U2, U3 > U1 > U0, when the selection circuit is realized in accordance with the CMOS technology comprising n-insulating islands in a p-substrate, and U2, U3 < U1 < U0 when the selection circuit is realized in accordance with the CMOS technology comprising p-insulating islands in an n-substrate;

wherein a first circuit means provides a first or a second selection signal (a, b) to the first or the second inverter (IV1, IV2) respectively, and a second circuit means provides a third selection signal (c) to the gates of both said intermediate and said additional transistor (MT, ZT) with the third selection signal (c) meeting one of the Boolean logic functions:

$$c = \overline{\overline{a} \cdot b} = a + \overline{b} \text{ or } c = \overline{\overline{a} \cdot b} = \overline{a} + \overline{b}$$

2. A selection circuit as claimed in claim 1, wherein the four potentials (U0, U1, U2, U3) are selected by means of the four states of a two-digit binary signal (A, B) which is applied to an input logic gate, at the first or second or third output of which there appears the first or second or third selection signal (a, b, c), respectively, which signal to input to the first or second inverter.

3. A selection circuit as claimed in claim 2, wherein said input logic gate comprises a NAND gate circuit including a maximum of three inverters (I1, I2, I3).

4. A selection circuit as claimed in claim 3, wherein the input logic gate connects the first binary signal digit (A) directly to the first output and connects the second binary signal digit (B), however, by the insertion of an inverter (I2) to the second output, and the third output is the output of the NAND gate (NA), with the two inputs thereof being connected to the first and the second output, respectively.

5. A selection circuit as claimed in claim 3, wherein the input logic gate connects the first or the second binary signal digit (A, B), each via an inverter (I1, I2) to the first or the second output respectively, and the third output is the output of the NAND gate (NA), to the one input of which there is applied the first binary signal digit (A), with the other input thereof being connected to the second output.

6. A selection circuit as claimed in claim 2, wherein said input logic gate comprises a NOR gate circuit including a maximum of five inverters.

7. A selection circuit as claimed in claim 6, wherein the input logic gate connects the first binary signal digit (A) directly to the first output and connects the second binary signal digit (B) via an inverter (N2) to the second output, and the third output is the output of another inverter (N5) whose input is connected to the output of the NOR gate (NO), to the one input of which the second binary signal digit (B) is applied, with the other input thereof being connected to the output of a further inverter (N1) to the input of which the first binary signal digit (A) is applied.

8. A selection circuit as claimed in claim 6, wherein the input logic gate connects the first or the second binary signal digit (A, B), each time via an inverter (N1, N2) to the first or the second output respectively, the third output is the output of a further inverter (N5) whose input is connected to the output of said NOR gate (NO), and the first input of said NOR gate (NO) is connected to the first output, while the second binary signal digit (B) is applied to its second input.

9. A selection circuit as claimed in claim 1, wherein the two potentials (U2, U3) are identical.

10. An integrated selection circuit for three potentials corresponding to the zero point of the circuit (UO) and two additional potentials differing therefrom (U1, U2) which is realized in a complementary insulated-gate field-effect transistor (CMOS) technology, comprising:
- a first inverter (IV1) comprising first and second complementary channel type transistors (T11, T12) connected in series between the first (U1) and the third potential (U2), said first transistor (T11) connected to the first potential (U1) with its substrate connected to the zero point of the circuit (U0), and said second transistor (T12) having its substrate connected to the third potential (U2), and
- a second inverter (IV2) comprising two complementary channel type transistors (T21, T22) connected in series, said transistor T21 connected to the zero point of the circuit, the second inverter (IV2) being connected between the zero point of the circuit and the output of the first inverter (IV1), the substrate of the transistor T21 is connected to the zero point of the circuit, and the substrate of the other transistor T22 forming an insulating island and is connected to the source electrode thereof and to the output of the first inverter; the common connection of the two transistors T21 and T22; forming the output of the selection circuit,
- the three potentials satisfying the relationship: $U2 > U1 > U0$, when the selection circuit is realized in accordance with the CMOS technology comprising n-insulating islands in a p-substrate, and $U2 < U1 < U0$ when the selection circuit is realized in accordance with the CMOS technology comprising p-insulating islands in an n-substrate,
- wherein a first circuit means provides a first or a second selection signal (a, b) to the first or the second inverter (IV1, IV2) respectively.

* * * * *